United States Patent [19]

Gore et al.

[11] Patent Number: 5,278,770
[45] Date of Patent: Jan. 11, 1994

[54] METHOD FOR GENERATING INPUT DATA FOR AN ELECTRONIC CIRCUIT SIMULATOR

[75] Inventors: Brooklin J. Gore, 1703 N. 16th, Boise, Id. 83702; Layne Bunker, 825 W. Victory, Boise, Id. 83706

[73] Assignees: Brooklin J. Gore; Layne Bunker, both of Boise, Id.

[21] Appl. No.: 543,206

[22] Filed: Jun. 25, 1990

[51] Int. Cl.⁵ .................................................. G06F 15/16
[52] U.S. Cl. .................................. 364/490; 364/489; 364/488; 364/578
[58] Field of Search ............... 364/488, 489, 490, 491, 364/578; 395/500, 800

[56] References Cited

U.S. PATENT DOCUMENTS

| | | | |
|---|---|---|---|
| 4,763,289 | 8/1988 | Barzilai et al. | 364/578 |
| 4,868,785 | 9/1989 | Jordan et al. | 364/900 |
| 4,961,156 | 10/1990 | Takasaki | 364/578 |
| 5,084,824 | 1/1992 | Lam et al. | 364/490 |

Primary Examiner—Kevin A. Kriess
Attorney, Agent, or Firm—Marger, Johnson, McCollom & Stolowitz

[57] ABSTRACT

A method for generating input data for a SPICE simulator in which a preprocessor computer program automatically assigns one of the models in the SPICE deck for modeling a particular device in a circuit simulated by the SPICE deck. Data which specifies valid device size ranges for a particular model is added to the SPICE deck prior to preprocessing. The model is assigned by the preprocessor computer program based upon device size, whether it is connected to power supply or ground and device type (P or N). The preprocessor output data is in a format usable by a commercially available SPICE program.

17 Claims, 3 Drawing Sheets

METHOD FOR GENERATING INPUT DATA FOR AN ELECTRONIC CIRCUIT SIMULATOR

BACKGROUND OF THE INVENTION

1. Field of the Invention

The present invention relates to electronic circuit simulators and more particularly to a method for preprocessing input data for such a simulator.

2. Description of the Related Art

In a typical electronic circuit design situation, the designer begins by drawing a design of the circuit which the designer considers appropriate for a given application. Prior to the advent of electronic circuit simulators, a physical prototype or "breadboard" of the circuit would then be made, using a kit of parts (resistors, diodes, transistors, etc.) normally used by the designer's company in manufacturing circuits. The physical circuit would then be tested to determine if it operated as intended. If it did not, the designer would modify the design and the physical prototype, retest the modified prototype, and continue iteratively to refine the design until it operated satisfactorily.

Simulators have come to be widely used to facilitate the computer-aided engineering (CAE) and design (CAD) of electronic circuits and systems. Simulation enables a user to work with a proposed circuit at much less expense than it would be to work with a physical embodiment of the circuit. Simulation also enables the user to vary parameters of operation of the circuit more quickly than in a physical circuit.

A number of simulators have been developed which simulate the operation of integrated electronic circuits. The most widely used such simulator is SPICE, described by L. W. Nagel and D. O. Pederson, "Simulation Program With Integrated Circuit Emphasis (SPICE), " 16th Midwest Symposium on Circuit Theory, Waterloo, Ontario, (Apr. 12, 1973), and available as Electronics Research Laboratory Report No. ERL-M383, University of California, Berkeley, (Apr. 12, 1973). SPICE is a descendant of a simulator known as CANCER. L. W. Nagel and R. A. Rohrer, "Computer Analysis of Nonlinear Circuits, Excluding Radiation (CANCER)," IEEE J. Solid-State Circuits, Vol. SC-6, pp. 166-182, (August, 1971). A detailed description of SPICE is provided in L. W. Nagel, "SPICE2: A Computer Program to Simulate Semiconductor Circuits," Electronics Research Laboratory Report No. ERL-M520 (May 9, 1975), and Ellis Cohen, "Program Reference for SPICE2," Report No. ERL-M592, both available from the Department of Electrical Engineering and Computer Science, University of California, Berkeley. The foregoing cited papers are incorporated herein by reference.

SPICE and other integrated circuit simulators typically include a lumped parameter characterization of ideal components used in an integrated circuit. These include passive components such as resistors, inductors and capacitors. Active components, such as diodes, bipolar transistors and field effect transistors (JFETs and MOSFETs), are provided by models which include a specification of various structural features and parameters that affect their operation. SPICE is also capable of simulating ideal current and voltage sources, and these sources can be either independent or controlled by other currents or voltages in a circuit.

In the prior art, after design of the circuit, the designer typically generates, at a keyboard input to a computer, a line of code which specifies each device in the circuit. The active devices are typically specified by an identifying number, a set of node numbers which identifies the circuit nodes to which the device terminals are attached, whether the device is N or P type, the device width and length and the model assigned to simulate operation of the device.

The model assigned to simulate a particular device depends upon several factors. First, if the device is connected to a power supply or to a ground node, a different model may be selected if the device is not so connected. Secondly, some models are suitable for modelling P type devices whereas others are designed to model N type devices. Finally, a particular model is typically suitable only for devices within a given size range. Thus, the circuit designer is faced with assigning a particular model for each device in the circuit. This presents a tedious task for an integrated circuit having several thousand active devices.

One SPICE program which operates generally as described above is HSPICE, Version 8907, published by Meta Software of San Jose, Calif. HSPICE includes an accompanying user's manual which is incorporated herein by reference. Two types of input data are typically provided to a SPICE program, such as HSPICE. First, model data defines a preselected number of models, including models of active components. Each active component model includes a specification of various structural features and parameters. Secondly, device data is provided in the form referred to above, namely a device number, the circuit nodes to which the device is connected, device size and type and identification of one of the models from the model data for modeling the particular device.

Data specifying a particular model is referred to as a model card while data specifying a particular device is referred to as a device card. Each set of data comprises a line of code in a listing. Such nomenclature stems from the days when a punched computer card contained the data necessary for each specified model or device. All of the device cards and model cards are referred to collectively as a SPICE deck. The model cards are developed by empirical testing of a physical device and may be used in simulations of different circuits made with similar processes. The device cards are hand coded, i.e., data is entered at a keyboard, for a particular circuit design. When the SPICE deck is loaded into a computer programmed with an electronic circuit simulator, the computer simulates operation of the circuit.

Also known in the prior art is use of a schematic computer program, like the EDGE schematics package by Cadence Design Systems, in which a schematic diagram of the integrated circuit design is created. Such a program can automatically provide a portion of the device card data, namely device number, circuit nodes to which the device is connected and device type and size. The model selected to model a particular device is based on the device size, whether it is connected to a power supply or ground and device type. Model selection is determined by the designer and data indicating a particular model is added to each device card by hand-coding the same from a computer terminal.

Each model includes data indicating whether the model is appropriate for modeling a device connected to a power supply or to ground and whether the model is suitable for a P or an N device. Although a particular model is generally valid only for modeling devices within a specified size range, SPICE programs typically do not have an input data format to accommodate data indicating the device size range for which the model is valid. The data in the model card thus provides no indication as to the device size range for which the model is valid.

It would be desirable to eliminate the hand-coding associated with assigning a model to each device.

It is a general object of the present invention to provide a less time consuming and less error prone method for generating input data for an electronic circuit simulator which automatically assigns a model for each device in a specified electronic circuit.

It is a more specific object of the present invention to provide such a method which generates data specifying the circuit devices, and an associated model for each device, in a format compatible with the data input format for an electronic circuit simulator.

It is another specific object of the present invention to provide such a method in which each model for an active device is associated with a device size range for which the model is valid.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
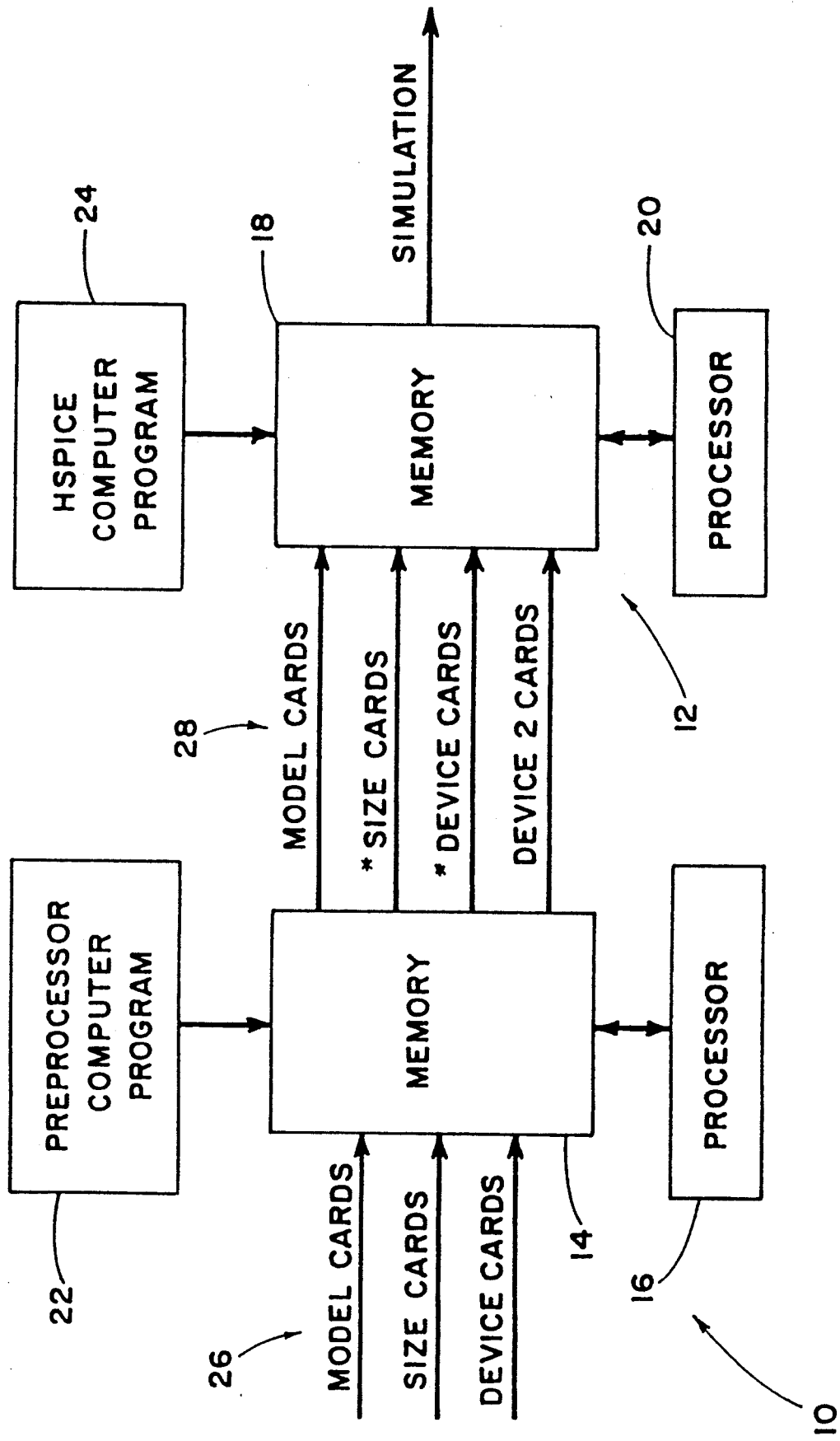
FIG. 1 is a schematic diagram illustrating the inputs and outputs of a first computer programmed with a preprocessor computer program in accordance with the present invention and a second computer programmed with an HSPICE electronic circuit simulator.

The following code is an example of two conventional model cards which contain data in a format compatible with the data input format for the HSPICE simulator program.

```
*MODEL CARD FOR 50/15 N-CHANNEL
  DEVICE VB=-2.5
+ LOT#0237.1-2 "AMB"
(1) .MODEL N15 NMOS (LEVEL=3 VTO=.64
    GAMMA=.34
+ TOX=250E-10 CGSO=264.2PF CGDO=264.2PF
    CJ=.166M MJ=.44
+ CJSW=.127N MJSW=.28 TPG=1 LD=.08U
    PB=.91 PHI=.62
+ NSUB=1E16 UO=550 VMAX=2.5E5 THETA=.09
    ETA=0.003
+ KAPPA=3 XQC=.45)
*
*MODEL CARD FOR 50/15 N-CHANNEL
  DEVICE VB=-2.5
+ LOT#0237.1-2 "AMB"
(2) .MODEL NF15 NMOS (LEVEL=3 VTO=.64
    GAMMA=.34
+ TOX=250E-10 CGSO=264.2PF CGDO=264.2PF
    CJ=.166M MJ=.44
+ CJSW=.127N MJSW=.28 TPG=1 LD=.08U
    PB=.91 PHI=.62
+ NSUB=1E16 UO=550 VMAX=2.5E5 THETA=.09
    ETA=0.003
+ KAPPA=3 XQC=.45)
```

The first model card, identified by the numeral (1) above, is used for devices not connected to power or ground and is identified with the model name N15 while the second model card, identified by the numeral (2) above, is identified with the model name NF15 and is used for devices connected to power or ground. Each model card begins with the .MODEL identifier. The models are developed empirically from measurements of selected characteristics of actual devices. The HSPICE program utilizes the data specifying a model to simulate a particular device in an electronic circuit. Each code line beginning with an asterisk is a comment line and is disregarded by the HSPICE program. Such a line is referred to herein as being commented out. The plus signs indicate that a single card is continued on the next line.

The following is a line of code generated by a CAD schematics package sold under the EDGE trademark by Cadence Design Systems. This line of code, referred to herein as a device card or first set of design data, includes information which specifies a particular device in an electronic circuit, the nodes in the circuit to which the device terminals are connected and whether the specified device is P or N type.

(3) M$#324 61 44 198 3 N W=125U L=8U

In device card (3), number 324 is a number assigned to uniquely identify the device while the following four numbers are assigned to different nodes in the circuit to identify the connecting points for the device terminals in the circuit. The following letter N indicates that the device is N type and the W and L data indicate a device size of 125 microns wide by 8 microns long. Device card (3) identifies a MOS transistor in an electronic circuit design (not shown).

As previously mentioned herein, each model is suitable for modeling devices only within a given device size range. In the present implementation of the invention, a new card or code line for each model card is created, as follows:

(4) .SIZES N15 6 X 40 X
*
(5) .SIZES NF15 6 X 40 X

Each such line is referred to herein as a size card or as a set of model-size data or cards. Included therein is information specifying a device-size range for which a particular model is useable. For example, the first size card above begins with .SIZES to indicate that is a size card. Next is the N15 designation indicating that that card relates to model N15. Next are the size ranges for which the model is valid. The numeral 6 indicates that it is valid for devices with a length greater than 6 microns with X designating the upper end of the range. In the present implementation of the invention X is essentially infinity. The numeral 40 refers to the device width in microns with the following X indicating the upper width range for which the model is valid. Thus, model N15 is valid for devices having a length greater than 6 microns and a width greater than 40 microns.

The next size card contains the same information but for model NF15. Model NF15 is thus also valid for devices having a length greater than 6 microns and a width greater than 40 microns. As is the case with the data included in the model cards, the data in each of the size cards is determined empirically, in a known manner, through measurement of various parameters of actual devices.

Turning now to FIG. 1, indicated generally at 10 is a first computer and at 12 is a second computer. Computer 10 includes therein a memory 14 and a processor 16. Computer 12 includes therein a memory 18 and a processor 20. Each computer includes the usual input-/output devices (not shown), including a keyboard. A SPICE preprocessor computer program 22 written in accordance with the present invention, is loaded into memory 14 of computer 10. A commercially available HSPICE computer program 24 is loaded into memory 18 of computer 12.

Indicated generally at 26 are inputs to memory 14, including model cards, like model cards (1), (2), above; size cards, like size cards (4), (5), above; and device cards, like device card (3), above, also referred to herein as a first set of design data.

Indicated generally at 28 are outputs from memory 14 which are generated by processor 16, under the control of program 22, utilizing inputs 26 in a manner which is hereinafter described. As illustrated schematically in FIG. 1, outputs 28 are also inputs to memory 18 when processor 20 is controlled by HSPICE program 24 to produce an electronic circuit simulation. Outputs 28 include the same model cards included in inputs 26. Also included are the same size cards and device cards; however, the size and device cards have been commented out with an asterisk and are thus disregarded by processor 20 when the same is under control of program 24. Output 28 further includes a second set of design data or cards, identified as device2 cards in FIG. 1. Description of how processor 16 under control of program 22 generates device2 cards follows with reference to the flow chart of preprocessor computer program 22 in FIGS. 2A and 2B.

The cards in inputs 26 are placed together to form a single listing of code referred to herein as a SPICE deck. In box 30, the first card in the deck is read. In box 31, if the card is a model card it is added to a model table in box 32. In box 34, since the card is not the last card in the deck, the program returns to box 30. The model table is simply a listing of all of the model cards in the SPICE deck which is created in memory 14.

Returning again to box 31, if the card read is not a model card the program determines, in box 36, if it is a size card. If not, the program returns via box 34 to box 30. If it is a size card, the program checks to determine whether there is a corresponding model in the model table. As will be recalled, each model card, like model cards (1), (2), above, have an associated size card, like size cards (4), (5), respectively, which indicate a device size range for which the associated model is valid. There should be a single associated size card for each model card and vice versa in the SPICE deck. In box 38, if there is no corresponding model in the table created in box 32 for the size card, the program prints an error message and terminates in box 40.

If there is a corresponding model in the model table for the size card under examination, the size information is added to the model table entry, in box 42, thus associating the model and its valid device size ranges in memory 14. If the size card is not the last card in the deck, box 34 returns the program to box 30 for reading the next card. When the last card in the deck is reached, the SPICE deck is rewound to the first card therein in box 44.

Figure 2A:
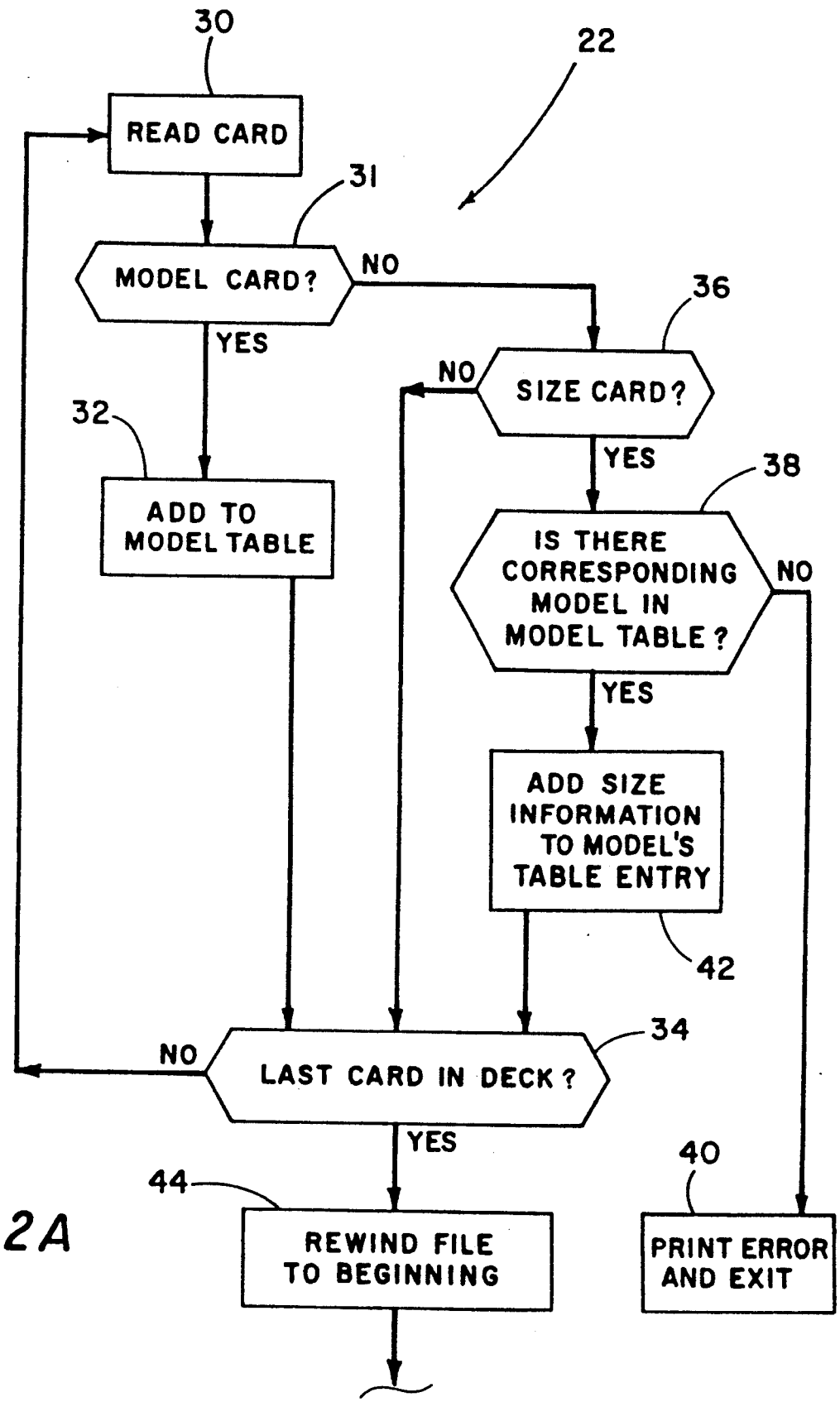
FIGS. 2A and 2B are a flow chart of the preprocessor computer program of FIG. 1.

Thus, after operation of the program as illustrated in FIG. 2A, a table is created in memory 14 which associates each model card with a range of device sizes for which the model is valid. Continuing in FIG. 2B, the first card in the deck is again read in box 46. A determination is made as to whether or not the card is a device card, like device card (3) above, in box 47. If the card is not a device card the program jumps to box 48 and if the card under examination is the last card in the SPICE deck, the program terminates in box 50. If not the last card, the program returns to box 46 and reads the next card.

When a device card is found in box 47, it is examined to see whether it is N or P type in box 49. As will be recalled each device card includes an entry indicating the type of device specified in the card. If not an N-type device, program moves to box 52 and determines whether or not the device is connected to ground or power supply voltage. As will be recalled, each device card, like device card (3) above, includes node numbers indicating the connection points in the circuit for the terminals, such as source, drain, etc. of the device.

The Edge schematics program referred to previously herein assigns one node number to the power supply and another node number, typically zero, to ground. Although not illustrated in the drawings herein, the ground and power supply node numbers are provided to memory 14 along with inputs 26. Thus, the program can determine, in box 52, from the node numbers of the device card under examination whether or not it is connected to ground or power supply. If it is, in box 54 the table set up by that portion of the program diagram in FIG. 1A is examined to determine whether there is a P-type ground/supply model which is valid for the size device specified in the device card under examination. If not, an error message so indicating is printed in box 56 and the program terminates. This gives the operator an opportunity to add additional model and size cards to the SPICE deck, which are suitable for modeling the device under consideration, and thereafter running the program again.

If it is determined in box 54 that a valid model is in the table, the program moves from box 54 to box 58 where the name of the model selected in box 54 is applied to the device card data under consideration. This creates what is referred to herein as a second set of design data or cards. Such data is identified in outputs 28 in FIG. 1 as device2 cards. The following code line (6) comprises a device2 card:

(6) M5324 61 44 198 3 N15 W=30.25U L=2.10U PS=74.50U AS=211.75P PD=74.50U AD=211.75P

Device2 card (6) includes the model identifier N15. All data in device2 card (6) is an actual line of code from a preprocessor constructed in accordance with the present invention, as are the other five code lines disclosed herein. The data appearing after the model identifier N15 in device2 card (6) is a result of operations of another portion of the preprocessor program (not disclosed herein) and is not relevant to the present invention. Device2 card (6) is in a format usable in connection with HSPICE computer program 24.

After creation of a device2 card in box 58, box 48 checks to see whether the device card under consideration is the last card in the deck and if so, exists in box 50. If not, the next card is read again in box 46.

Returning again to box 52, if the device card under consideration is not connected to ground or power supply the program examines the model table to determine whether or not there is a P-type model valid for the size of device under consideration (in box 60). If not, the error message in box 56 is again printed so that an appropriate model and size card may be added to the SPICE deck. If so, the model name is applied in box 58 to the device card as previously described in connection with the operation of box 58.

Returning again to box 49 if the device in consideration is an N-type device, box 62 examines the device data to determine whether the device is connected to ground or power supply. If not, in box 64 the table is examined to determine whether an N-type model is valid for the size of device under examination in the same fashion that the program examined the P-device in box 60 to make this determination. If so, the model name is applied to the device card under consideration in box 58 and another card is read. If all cards in the deck have been examined the program exits in box 50.

Returning again to box 62, if the N-type device under consideration is connected to ground/power supply, in box 66 the table is examined to determine whether there is an N-type ground/supply model valid for the device size in the same fashion that box 54 examined the table in connection with P-type devices.

If no such model exists, an error is printed in box 68 in the same fashion as in box 56.

As can be seen, each time a model name is successfully applied to a device card in box 58, the program moves to the next card to repeat the process of assigning a model name until all of the cards in the deck are read at which point the program terminates in box 50.

Figure 2B:
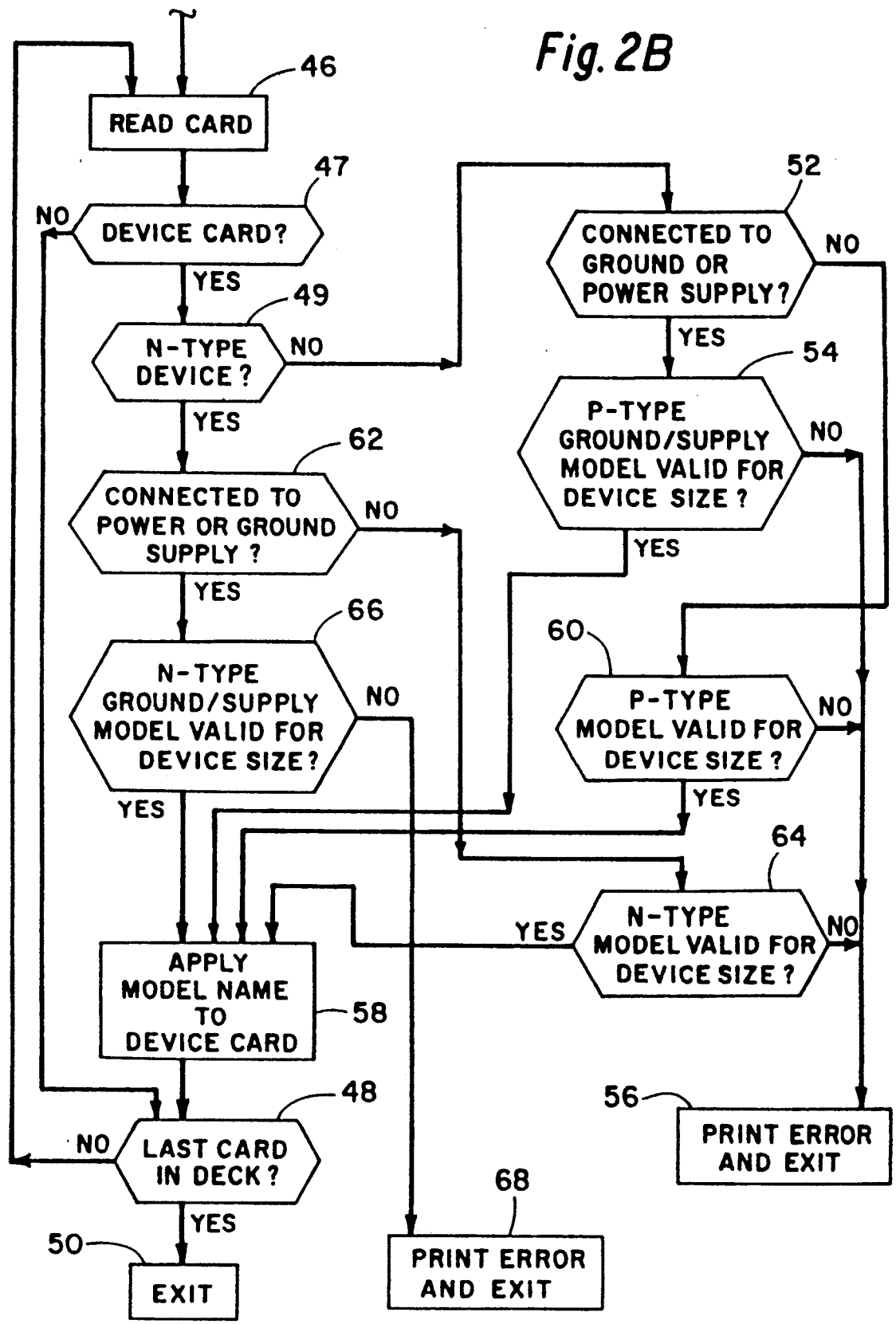

Although not illustrated in the flow chart of FIGS. 2A and 2B, the device cards examined in box 47 are commented out after program 22 runs as are the size cards. Thus, as illustrated in FIG. 1, only the model cards and device2 cards, which contain the name of a model for modeling the particular device, are provided to memory 18. Both the model cards and device2 cards provided are in the format required by HSPICE computer program 24.

It is thus seen that the preprocessor program of the present invention automatically assigns models to each device in an electronic circuit. Data indicating the assignment is produced in a format compatible with the input format of an electronic circuit simulator.

Having illustrated and described the principles of my invention in a preferred embodiment thereof, it should be readily apparent to those skilled in the art that the invention can be modified in arrangement and detail without departing from such principles.

We claim all modifications coming within the spirit and scope of the accompanying claims:

1. A method for generating input data for an electronic circuit simulator, said method comprising the steps of:
    providing a user-specified design of an electronic circuit which includes a plurality of circuit elements;
    generating a first set of design data which specifies each circuit device and its connections in said circuit;
    providing model data comprising a plurality of models which each characterize the operation of an electronic circuit device;
    loading the design data and model data into the memory of a computer;
    using the computer to associate one of the models with each specified circuit device;
    using the computer to generate a second set of design data in the computer memory which specifies each circuit device, its connections in said circuit and the model associated therewith;
    providing said model data and said second set of design data to said electronic circuit simulator in a format compatible with the data input format for the electronic circuit simulator; and
    running the simulator thereby simulating the circuit in said user-specified design.

2. The method of claim 1 wherein the step of providing model data comprising a plurality of models which each characterize the operation of an electronic circuit device comprises the steps of:
    providing a set of such models in a format compatible with the data input format for the electronic circuit simulator; and
    providing a set of model-size data which includes information specifying a device-size range for which each model in said model data is usable.

3. The method of claim 2 wherein the step of using the computer processor to generate a second set of design data in the computer memory which specifies each circuit device, its connections in said circuit and the model associated therewith comprises the steps of:
    creating a table in the computer memory which specifies a device-size range for which each model in said model data is usable;
    selecting a model for each circuit device in said first set of design data; and
    associating each selected model with said first set of design data.

4. The method of claim 3 wherein said first set of design data includes a size for the device specified and wherein the step of selecting a model for each circuit device in said first set of design data comprises the step of selecting a model having a device-size range within which the size of the selected device is included.

5. The method of claim 1 wherein the first set of design data includes data indicating whether each specified device is P or N type and said model data includes data indicating whether a particular model is suitable for modeling P or N type devices and wherein the step of using the computer to generate a second set of design data in the computer memory further comprises the step of selecting a model suitable for modeling each circuit device in said first set of design data.

6. The method of claim 1 wherein the first set of design data includes data indicating whether each specified device is connected to a power supply and said model data includes data indicating whether a particular model is suitable for modeling a device connected to a power supply and wherein the step of using the computer to generate a second set of design data in the computer memory further comprises the step of selecting a model suitable for modeling each circuit device in said first set of design data.

7. The method of claim 1 wherein the first set of design data includes data indicating whether each specified device is connected to a power supply and said model data includes data indicating whether a particular model is suitable for modeling a device connected to a power supply and wherein the step of using the computer to generate a second set of design data in the compute memory further comprises the step of selecting a model suitable for modeling each circuit device in said first set of design data.

8. A method for preprocessing a SPICE deck of the type having model cards which each characterize the operation of an electronic device and device cards which each specifies a circuit device and its connections in a circuit, said method comprising the steps of:
- generating a set of model-size cards which includes information specifying a device-size range for which each model card in said SPICE deck is usable;
- including said model-size cards in said SPICE deck;
- loading said SPICE deck into the memory of a computer;
- using the computer to create a table in the computer memory which specifies a device-size range for which each model card is usable;
- using the computer to associate one of the model cards with each device card; and
- using the computer to generate a second set of device cards which specifies each circuit device, its connections in the circuit and the model associated therewith.

9. The method of claim 8 wherein said method further includes the steps of:
- providing said model cards and said second set of device cards to an electronic circuit simulator in a format compatible with the data input format for said simulator; and
- running the simulator thereby simulating the circuit.

10. The method of claim 9 wherein said first-mentioned device cards include data indicating whether each specified device is P or N type and said model cards include data indicating whether a particular model is suitable for modeling P or N type devices and wherein the step of using the computer to generate a second set of device cards further comprises the step of selecting a model card suitable for modeling each circuit device in said first-mentioned device cards.

11. The method of claim 9 wherein said first-mentioned device cards include data indicating whether each specified device is connected to a power supply and said model cards include data indicating whether a particular model card is suitable for modeling a device connected to a power supply and wherein the step of using the computer to generate a second set of device cards further comprises the step of selecting a model card suitable for modeling each circuit device in said first-mentioned device cards.

12. The method of claim 9 wherein said method further comprises the step of commenting out said first-mentioned device cards and said model-size cards after the step of using the computer to generate a second set of device cards.

13. A method for preprocessing a SPICE deck of the type having model cards which each characterize the operation of an electronic device and device cards which each specifies a circuit device and its connections in a circuit, said method comprising the steps of:
- loading the SPICE deck into the memory of a computer thereby creating a set of model-card data in said memory and a set of device-card data;
- causing the computer processor to:
  - read the device-card data;
  - determine whether each device is P type or N type;
  - determine whether each device is connected to a power supply;
  - determine the size of each device;
  - read the model-card data; and
  - select a valid model based on the foregoing determinations.

14. The method of claim 13 wherein said method further comprises the step of causing the computer processor to generate a second set of device-card data which specifies the model associated with each device.

15. The method of claim 14 wherein the step of loading the SPICE deck into the memory of a computer thereby creating a set of model-card data in said memory and a set of device-card data further comprises the steps of:
- generating a set of model-size cards which includes information specifying a device-size range for which each model card in said SPICE deck is usable;
- including said model-size cards in said SPICE deck; and
- creating a table in the computer memory which specifies a device-size range for which each model card is usable.

16. The method of claim 14 wherein said method further comprises the step of generating said second set of device-card data further comprises the step of generating said second set of device-card data in a format compatible with the data input format of a circuit simulator.

17. The method of claim 1 wherein the step of generating a first set of design data is performed by a computer programmed with a schematic computer program.

* * * * *